(12) United States Patent
Nagata

(10) Patent No.: US 6,830,974 B2
(45) Date of Patent: Dec. 14, 2004

(54) METHOD OF FABRICATING A SEMICONDUCTOR DEVICE INCLUDING A TUNNEL OXIDE FILM

(75) Inventor: Toshio Nagata, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/606,792

(22) Filed: Jun. 27, 2003

(65) Prior Publication Data

US 2004/0082129 A1 Apr. 29, 2004

(30) Foreign Application Priority Data

Oct. 25, 2002 (JP) ........................................ 2002-311122

(51) Int. Cl.[7] ........................................ H01L 21/8247
(52) U.S. Cl. ........................................ 438/264; 438/763
(58) Field of Search ........................................ 438/257–267, 438/763

(56) References Cited

U.S. PATENT DOCUMENTS 5,108,939 A * 4/1992 Manley et al. .............. 438/594
5,661,056 A * 8/1997 Takeuchi ..................... 438/261
5,838,039 A * 11/1998 Sato et al. ................... 257/321
5,981,338 A * 11/1999 Lee ............................. 438/257
6,495,420 B2 * 12/2002 Tseng .......................... 438/267

FOREIGN PATENT DOCUMENTS

JP    08-255905    10/1996

OTHER PUBLICATIONS

James C.M. Hwang, "Relationship between gate lag, power drift, and power slump of pseudomorphic high electron mobility transistors", Solid–State Electronics 43 (1999), pp. 1325–1331.

* cited by examiner

Primary Examiner—Richard A. Booth
(74) Attorney, Agent, or Firm—Rabin & Berdo, P.C.

(57) ABSTRACT

A method of fabricating a semiconductor device includes the steps of forming a first film of silicon nitride or silicon oxynitride on a polysilicon layer, forming a second film of silicon oxide on the first film by chemical vapor deposition, and oxygen-annealing the second film to form a tunnel oxide film. The presence of the silicon nitride or silicon oxynitride film enables an annealing process with a high oxidation capability to be used without oxidizing the polysilicon layer. The leakage of unwanted current through the tunnel oxide film can thereby be reduced, improving the data retention characteristics of devices such as flash memories.

18 Claims, 7 Drawing Sheets

# METHOD OF FABRICATING A SEMICONDUCTOR DEVICE INCLUDING A TUNNEL OXIDE FILM

BACKGROUND OF THE INVENTION

1. Field of the Invention

The present invention relates to a method of fabricating a semiconductor device including a tunnel oxide film, more particularly an oxygen-annealed high-temperature oxide (HTO) film formed by chemical vapor deposition.

2. Description of the Related Art

Tunnel oxide films are used in, for example, nonvolatile memory devices such as flash memories. The use of oxygen annealing to reform the structure of an HTO film ($SiO_2$ film) formed by chemical vapor deposition (CVD), thereby creating a tunnel oxide film, is a known art. Normally, the oxygen annealing process is carried out for fifteen minutes at a temperature of 900° C. and a low oxygen level such as 1% $O_2$ (99% $N_2$). The annealing conditions are selected so that the thickness of the HTO film will not increase by more than ten angstroms (10 Å) or one nanometer (1 nm), because a greater increase in film thickness might adversely affect device characteristics.

A tunnel oxide film created in this way, however, permits more electrical current leakage than a normal thermal oxide film obtained by oxygen annealing of the surface of a silicon substrate or a polycrystalline silicon (polysilicon) film. Such current leakage may also adversely affect the device characteristics. FIG. 7 is a graph comparing breakdown voltages of a thermal oxide film and a low-oxygen annealed HTO film, both created as tunnel oxide films. The HTO film was annealed in a dry atmosphere under the conditions stated above (15 minutes, 900° C., 1% $O_2$). The data in FIG. 7 show that current is more likely to flow through the low-oxygen annealed HTO film than the thermal oxide film. The reason for this is thought to be that in the low-oxygen annealing process, the HTO film is inadequately annealed, so that unpaired silicon electrons remain, creating an electrically leaky film. If the leaky HTO film is used in a nonvolatile memory device such as a flash memory, the charge retention characteristics of the device are impaired, leading to reduced manufacturing yields and reduced device reliability.

For memory applications, there is a particular need to improve the insulation breakdown resistance (breakdown voltage) of tunnel oxide films obtained by oxygen annealing of an HTO ($SiO_2$) film deposited by CVD on a polysilicon film, but if an oxygen annealing process with a high oxidation capability is used so as to adequately reform the structure of the HTO film, oxidation of the tunnel oxide film proceeds so quickly that the underlying polysilicon film is also oxidized.

For a thermal oxide film formed on the surface of a silicon substrate or a polysilicon film, use of a two-stage oxygen annealing process has been proposed to improve the insulation breakdown resistance and reduce current leakage. In the proposed process, a high-temperature oxygen anneal is followed by a low-temperature oxygen anneal, as taught in Japanese Unexamined Patent Application Publication No. 8-255905, for example. The two-stage oxygen annealing process improves the insulation breakdown resistance of the thermal oxide film.

It would be desirable if a similar improvement could be achieved by adequately reforming a tunnel oxide film formed by an oxygen annealing process carried out on the HTO film, so as to more closely approach the insulation breakdown resistance of a thermal oxide film.

SUMMARY OF THE INVENTION

An object of the present invention is to provide a method of fabricating a semiconductor device so as to reduce electric current leakage in a tunnel oxide film formed on a polysilicon film.

The invented method includes forming a first film of silicon nitride or silicon oxynitride on a polysilicon layer, forming a second film of silicon oxide on the first film by CVD, and oxygen-annealing the second film to form a tunnel oxide film.

The presence of the silicon nitride or silicon oxynitride film enables the silicon oxide film to be annealed by an annealing process with a high oxidation capability without oxidizing the polysilicon layer. When a silicon nitride film is used, for example, wet oxygen annealing may be carried out for 5 to 10 minutes at 850° C. to 900° C. When a silicon oxynitride film is used, dry oxygen annealing may be carried out for 30 to 60 minutes at 850° C. to 900° C., or wet oxygen annealing may be carried out for 5 to 60 minutes at 850° C. to 900° C. Compared with the conventional low-oxygen annealing process, these processes reform the silicon oxide film more fully, leaving fewer unpaired silicon electrons, thereby reducing current leakage.

If a silicon oxynitride film is used, it may be formed together with the silicon oxide film in a continuous process.

The semiconductor device formed by the invented process may have, for example, a split floating gate comprising a first floating gate and a second floating gate mutually separated by the first film and the tunnel oxide film.

DETAILED DESCRIPTION OF THE INVENTION

Figure 1:
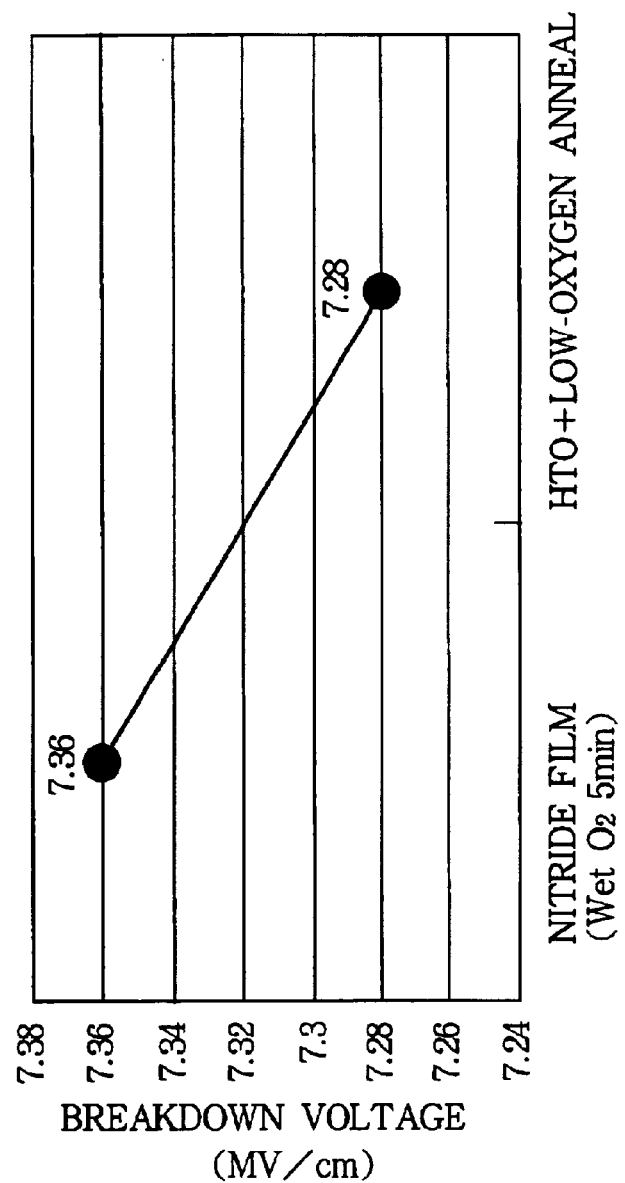
FIG. 1 is a graph comparing breakdown voltages of tunnel oxide films formed on a polysilicon layer with and without an intervening nitride film, illustrating a first embodiment of the invention.

Embodiments of the invention will now be described with reference to the attached drawings, in which like elements are indicated by like reference characters.

First Embodiment

In the first embodiment, the tunnel oxide film is formed on a nitride film on the polysilicon film. First, a nitride film approximately 15–20 Å (1.5–2.0 nm) thick is grown on the polysilicon film. The nitride film is grown in an $NH_3$ atmosphere in a low-pressure chemical vapor deposition (LP-CVD) apparatus at a temperature of 800° C.–850° C., a pressure of 3.0 to 4.0 torr, a flow rate of two to three standard cubic centimeters per minute (2–3 sccm), and a processing time of 20–30 minutes.

An HTO film is deposited on the nitride film by CVD; then an oxygen annealing process is carried out to form the tunnel oxide film. The HTO film is grown in an $SiH_4$-and-$N_2O$ atmosphere in the LP-CVD apparatus at a temperature of 780° C., a pressure of 0.36 torr, flow rates of 75 sccm for the $SiH_4$ gas and 150 sccm for the $N_2O$ gas, and a process time of 20–30 minutes.

The oxygen annealing process is a wet oxygen anneal with a high oxidation capability, carried out for 5–10 minutes (preferably 5–8 minutes) at a temperature of 850° C.–900° C. (preferably 850° C.–880° C.) and a moisture content of 80%–100% (preferably 90%–100%).

Because the HTO film is formed on a nitride film overlying the polysilicon film, an oxygen annealing process with a high oxidation capability can be used without oxidizing the polysilicon film. An oxygen annealing process with a high oxidation capability reduces the number of unpaired silicon electrons in the HTO film, as compared with currently used HTO films. The result of reforming the HTO film in this way is a less electrically leaky tunnel oxide film, improving the charge retention characteristics and reliability of a semiconductor device in which the tunnel oxide film is used.

FIG. 1 is a graph showing breakdown voltages of a tunnel oxide film created by carrying out the conventional low-oxygen annealing process on an HTO film formed on a polysilicon film and a tunnel oxide film created by carrying out the oxygen annealing process of this embodiment on an HTO film formed over a polysilicon film with an intervening nitride film. The low-oxygen annealing process was carried out for fifteen minutes at a temperature of 900° C. in a dry atmosphere with an oxygen level of 1% $O_2$ (99% $N_2$), while the oxygen annealing process of this embodiment was carried out for five minutes at a temperature of 850° C. in a wet atmosphere with an $H_2$—$O_2$—$N_2$ ratio of 1:1:0. The nitride film was 15–18 Å or 1.5–1.8 nm thick. To obtain these breakdown voltage data, measurements of breakdown voltages were performed at 56 measurement points in a measurement area of 20 mm². The graph shows the voltage values at which the current level reached one microampere per square centimeter ($1 \times 10^{-6}$ A/cm²).

FIG. 1 shows that the tunnel oxide film formed in this embodiment has a higher breakdown voltage and better insulation properties than the conventional film, for identical breakdown criteria of $1 \times 10^{-6}$ A/cm². The data indicate that the tunnel oxide film in this embodiment is less electrically leaky than the conventional film, demonstrating that the HTO film has been adequately reformed.

Second Embodiment

In a second embodiment, the tunnel oxide film is formed on an oxynitride film instead of on the nitride film used in the first embodiment. The oxynitride film may be grown to a thickness of approximately 8–10 Å (0.8–1.0 nm) on a polysilicon film in an $N_2O$ atmosphere in a vertical diffusion furnace at a temperature of 900° C., a pressure of 76 to 80 torr, a flow rate of 1.0–1.2 standard liters per minute (slm), and a processing time of 30–40 minutes. The HTO film is formed on the oxynitride film, and then the oxygen annealing process is carried out on the HTO film to create a tunnel oxide film.

Either a wet or a dry oxygen annealing process may be employed: the wet oxygen anneal should be carried out for 5–60 minutes (preferably 5–8 minutes) at a temperature of 850° C.–900° C. (preferably 850° C.–880° C.) and a moisture content of 80%–100% (preferably 90%–100%); the dry oxygen anneal should be carried out for 30–60 minutes (preferably 30–40 minutes) at a temperature of 850° C.–900° C. (preferably 850° C.–880° C.) and an oxygen concentration of 80%–100% (preferably 90%–100%). Both the wet and dry processes have a high oxidation capability.

Because the HTO film in this embodiment is formed on an oxynitride film overlying the polysilicon film, an oxygen annealing process with a high oxidation capability can be used without oxidizing the polysilicon film. As in the first embodiment, the number of unpaired silicon electrons in the HTO film is reduced, resulting in a less electrically leaky tunnel oxide film, as compared with currently-used HTO films, thereby improving the charge retention characteristics and reliability of the semiconductor device in which the tunnel oxide film is used.

Figure 2:
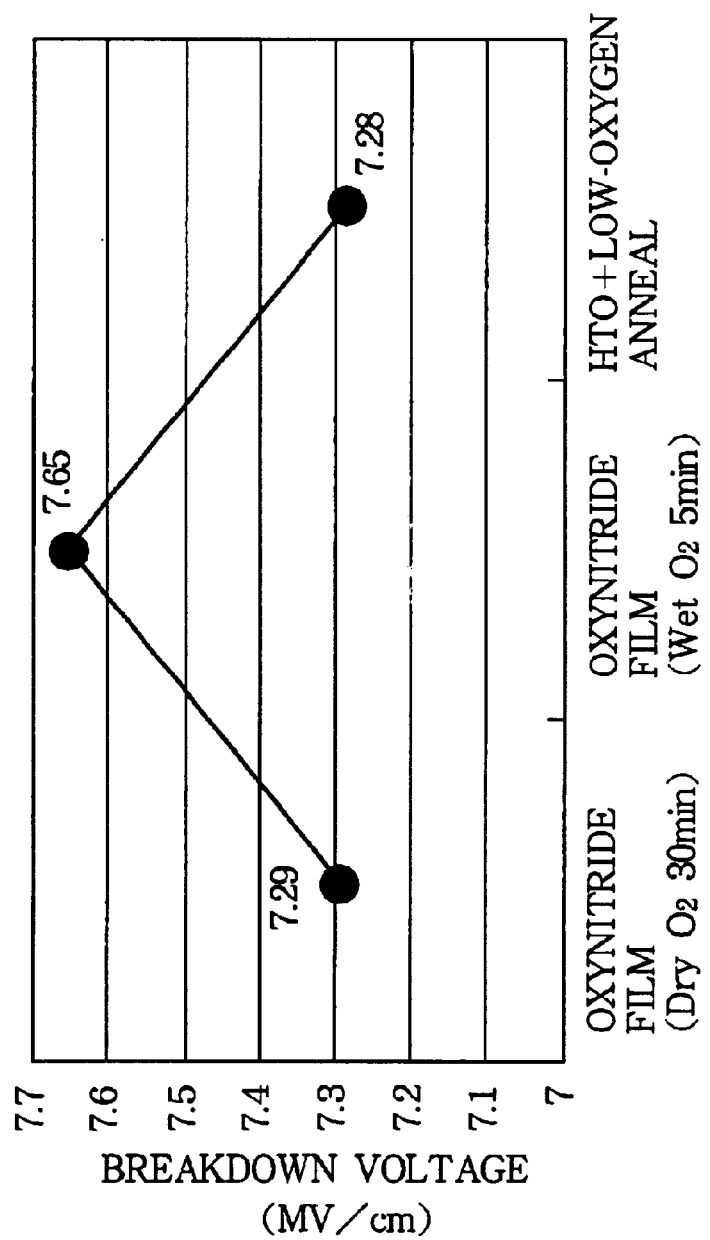
FIG. 2 is a graph comparing breakdown voltages of tunnel oxide films formed on a polysilicon layer with and without an intervening oxynitride film, illustrating a second embodiment of the invention.

FIG. 2 is a graph showing breakdown voltages of a tunnel oxide film created by carrying out the conventional low-oxygen annealing process (dry 1% $O_2$ (99% $N_2$) at 900° C. for 15 minutes) on an HTO film formed on a polysilicon film, and tunnel oxide films created by carrying out the oxygen annealing processes of this embodiment (dry 100% $O_2$ at 850° C. for 30 minutes in one case, and a wet atmosphere with an $H_2$—$O_2$—$N_2$ ratio of 1:1:0 at 850° C. for five minutes in the other case) on HTO films formed over polysilicon films with intervening oxynitride films. The oxynitride films were 8–10 Å or 0.8–1.0 nm thick.

FIG. 2 shows that the tunnel oxide films formed according to this embodiment have a higher breakdown voltage and better insulation properties than the conventional film, for identical breakdown criteria of $1 \times 10^{-6}$ A/cm², indicating that the tunnel oxide films in this embodiment are less electrically leaky and that the HTO film has been adequately reformed.

In the first embodiment, a dry oxygen annealing process did not produce a tunnel oxide film with a higher breakdown voltage. In the second embodiment, however, tunnel oxide films obtained by both wet and dry oxygen annealing exhibit electrical properties superior to those of conventional films.

The oxynitride film and the HTO film in this embodiment may be formed by a continuous process in situ. The HTO film is formed by CVD in an $SiH_4$-and-$N_2O$ atmosphere. The $N_2O$ gas can be used to form the oxynitride film before the HTO film is formed.

In the in situ oxynitridation sequence, one hundred wafers are placed in a boat, and the boat is inserted (loaded) into the LP-CVD apparatus at a temperature of 700° C. The apparatus is checked for leaks and its temperature is stabilized. $N_2O$ gas is then introduced, and an oxynitride film is grown in an $NH_3$ atmosphere at a temperature of 900° C., a pressure of 3.0 to 4.0 torr, a flow rate of 1.0–1.2 sccm, and a processing time of 20–30 minutes. Next both $N_2O$ and $SiH_2Cl_2$ gases are introduced, and the HTO film is grown at a temperature of 780° C., a pressure of 0.36 torr, an $SiH_2Cl_2$ flow rate of 75 sccm, an $N_2O$ flow rate of 150 sccm, and a processing time of 20–30 minutes. Then the apparatus is purged and returned to atmospheric pressure. The boat is taken out or unloaded from the apparatus at a temperature of 700° C. Finally, the hundred wafers are removed from the boat.

The oxynitride film and the HTO film are thus grown by a continuous process. The continuous formation of these films reduces the number of process steps and improves the throughput of the process.

Figure 3:
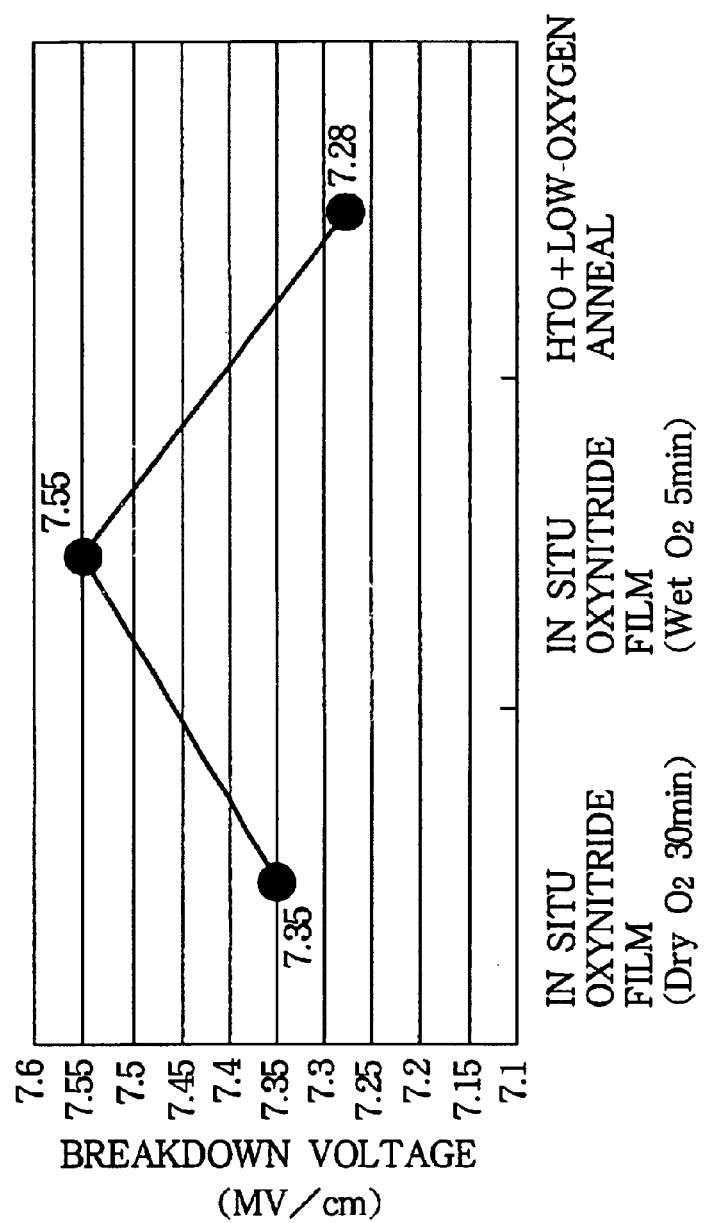
FIG. 3 is a graph comparing breakdown voltages of tunnel oxide films formed on a polysilicon layer with and without an intervening in situ oxynitride film, illustrating the second embodiment of the invention.

FIG. 3 is a graph showing breakdown voltages of a tunnel oxide film created by carrying out the conventional low-oxygen annealing process on an HTO film formed on a polysilicon film, and tunnel oxide films created by carrying out the oxygen annealing processes of this embodiment on HTO and oxynitride films formed by the in situ process described above. The oxygen annealing conditions were the same as in FIG. 2: 1% $O_2$ (99% $N_2$), 900° C., and 15 minutes for the conventional dry annealing process; 100% $O_2$, 850° C., and 30 minutes for the dry annealing process of this embodiment; and an $H_2$—$O_2$—$N_2$ ratio of 1:1:0, 850° C., and five minutes for the wet annealing process of this embodiment. The oxynitride films were 8–10 Å or 0.8–1.0 nm thick.

The results shown in FIG. 3 are similar to those in FIG. 2. For identical breakdown criteria of $1\times10^{-6}$ A/cm$^2$, the HTO films formed over a polysilicon film with an intervening oxynitride film 8–10 Å or 0.8–1.0 nm thick have a higher breakdown voltage and better insulation properties than the conventional film, even if the oxynitride film and the HTO film are formed by the in situ oxynitridation sequence described above.

Figure 4:
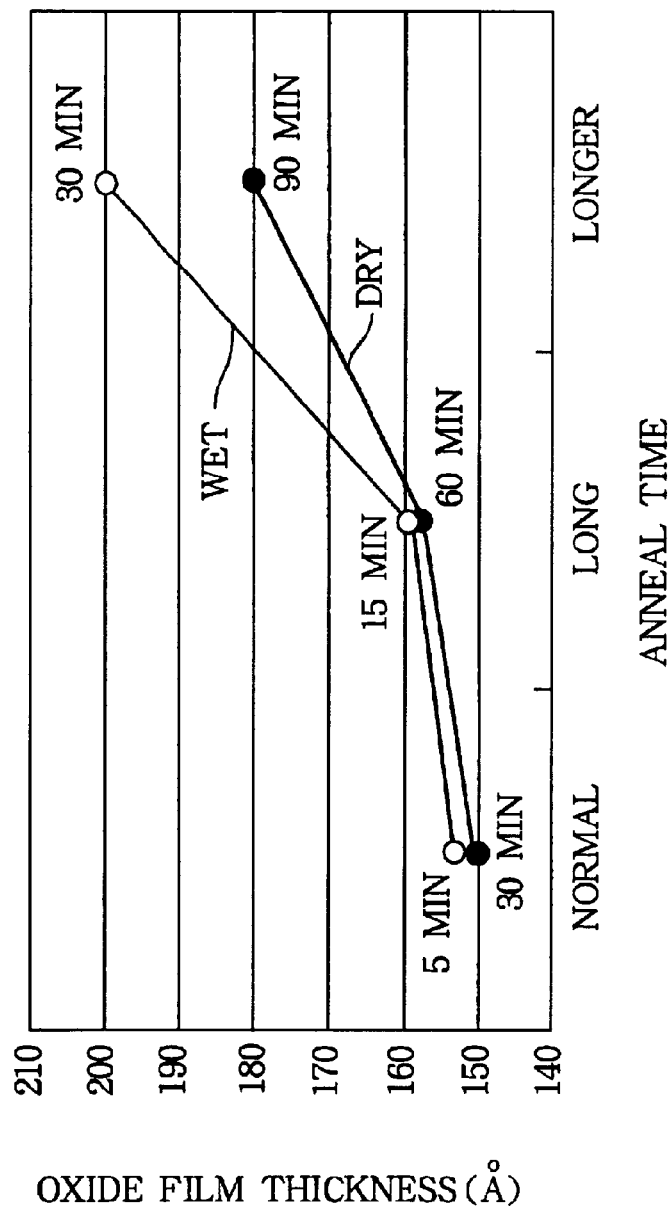
FIG. 4 is a graph showing thicknesses of tunnel oxide films formed on a polysilicon layer with intervening oxynitride films for various oxygen annealing process times, illustrating the second embodiment of the invention.

In this embodiment, in order to achieve a higher oxidation capability, the processing time of the oxygen annealing process may be increased. FIG. 4 shows the thicknesses of tunnel oxide films created by carrying out the oxygen annealing processes of this embodiment on HTO films formed over polysilicon films with intervening oxynitride films 8–10 Å or 0.8–1.0 nm thick. The dry oxygen annealing process was carried out at a temperature of 850° C. with an oxygen level of 100% $O_2$ for 30, 60, and 90 minutes. The wet oxygen annealing process was carried out at a temperature of 850° C. with an $H_2$—$O_2$—$N_2$ ratio of 1:1:0, for 5, 15, and 30 minutes.

The thickness of the HTO films before oxygen annealing was 160 Å (16 nm) or less. FIG. 4 shows that when the dry oxygen annealing process time exceeded 60 minutes, and when the wet oxygen annealing process time exceeded 15 minutes, the oxygen annealing process increased the thickness of the HTO film by more than 10 Å (more than 1 nm). Since an increase in the annealed HTO film thickness of more than 10 Å or 1 nm can adversely affect device characteristics, any increase in the oxygen annealing time should be limited so that the oxygen annealing time is within 60 minutes for the dry process and within 15 minutes for the wet process.

Figure 5:
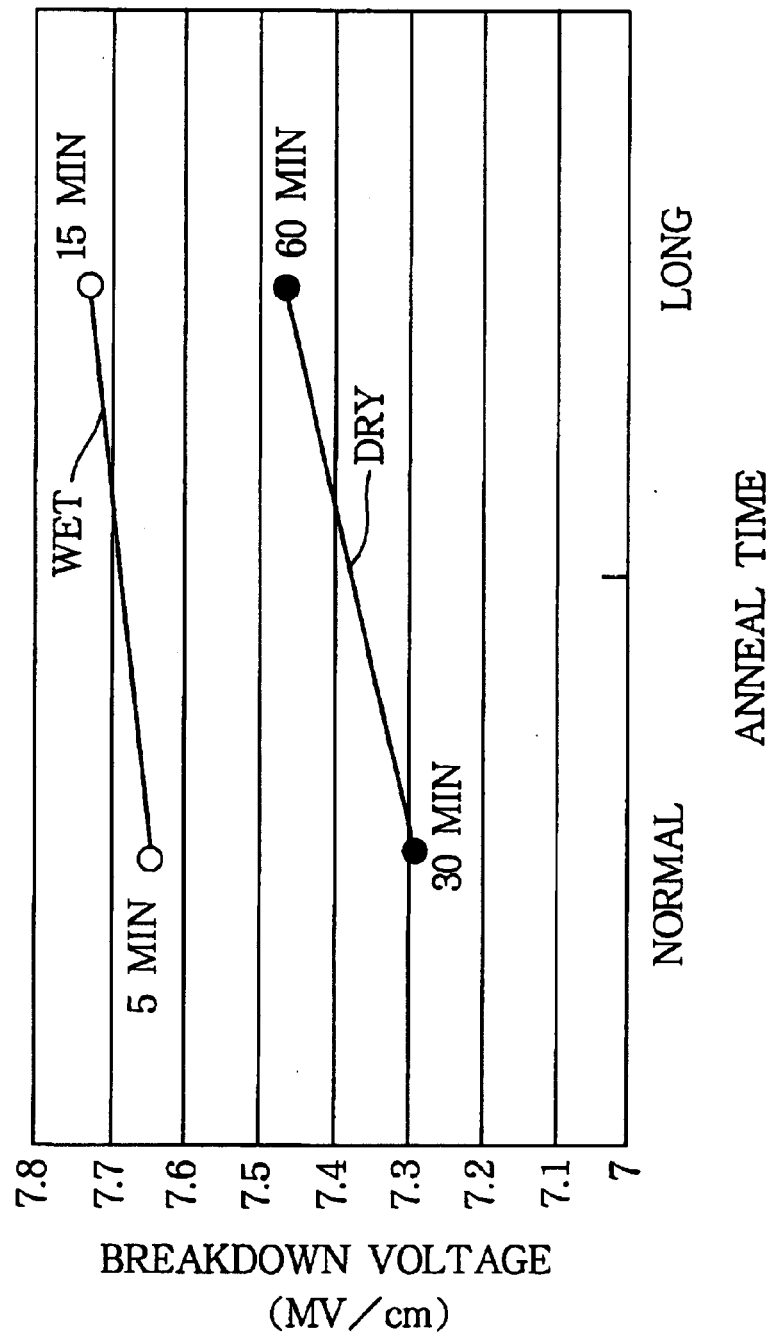
FIG. 5 is a graph showing breakdown voltages of tunnel oxide films formed on a polysilicon layer with intervening in situ oxynitride films for wet and dry oxygen annealing processes with various process times, illustrating the second embodiment of the invention.

FIG. 5 shows the breakdown voltages of tunnel oxide films created by carrying out the wet and dry oxygen annealing processes on HTO films formed on polysilicon films by using the in situ oxynitridation process sequence described above to create an intervening oxynitride film. The dry oxygen annealing processes were carried out at a temperature of 850° C. with an oxygen level of 100% $O_2$ for 30 minutes and 60 minutes, respectively. The wet oxygen annealing processes were carried out at a temperature of 850° C. with an $H_2$—$O_2$—$N_2$ ratio of 1:1:0 for five minutes and 15 minutes, respectively. The oxynitride films were 8–10 Å or 0.8–1.0 nm thick. The breakdown criterion was a $1\times10^{-6}$ A/cm$^2$ current flow.

FIG. 5 shows that if the oxygen annealing time is increased within the ranges described above, so that the thickness of the annealed HTO film does not increase by more than 10 Å or 1 nm, the breakdown voltage and insulation properties of the tunnel oxide films formed in this embodiment can be further improved, without impairing device characteristics.

Third Embodiment

In a third embodiment, the nitride film or oxynitride film of the first or second embodiment is applied to a semiconductor device such as a flash memory of the split-gate type.

Figure 6:
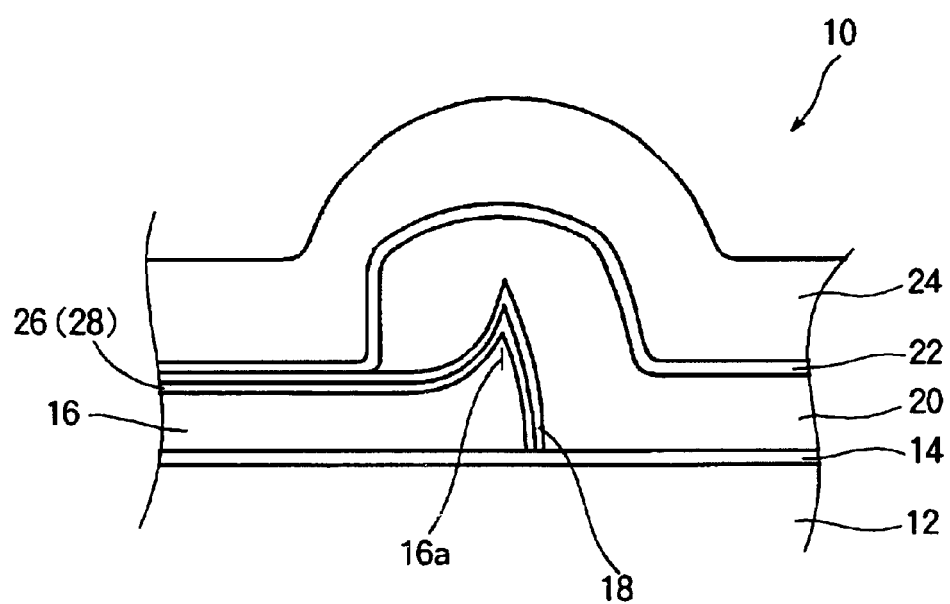
FIG. 6 is a sectional view schematically showing a semiconductor device according to a third embodiment of the invention.
Figure 7:
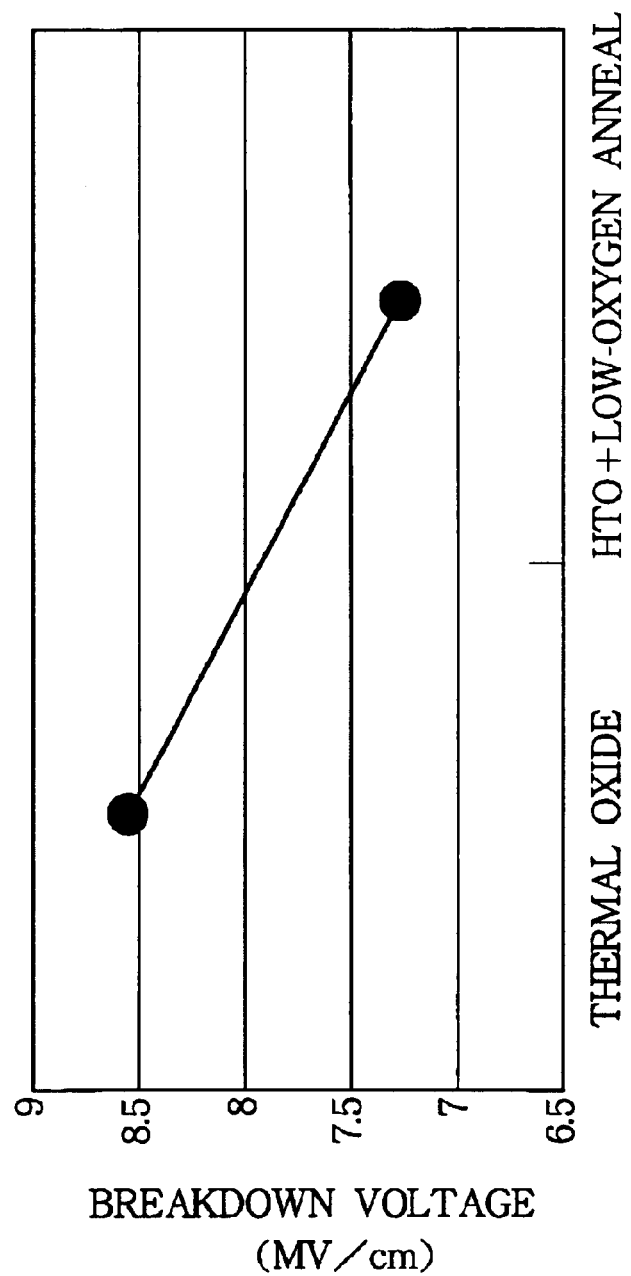
FIG. 7 is a graph showing breakdown voltages of a thermal oxide film and a low-oxygen annealed HTO film, both created as tunnel oxide films.

A semiconductor device 10 according to the third embodiment will be described in conjunction with its fabrication method. As shown in FIG. 6, when the semiconductor device 10 is fabricated, a gate insulating film 14 is first formed on a silicon substrate 12; then a polysilicon film is formed on the gate insulating film 14 as a first floating gate 16. An HTO film is formed over the first floating gate 16 as a tunnel oxide film 18; then a polysilicon film is formed on the tunnel oxide film 18 over the silicon substrate 12 as a second floating gate 20 overlapping an edge 16a of the first floating gate 16. Next, a gate insulating film 22 is formed over the second floating gate 20 and the first floating gate 16, and a control gate 24 is finally formed on the gate insulating film 22.

In the semiconductor device 10 configured as described above, the electric field is concentrated at the edge 16a of the first floating gate 16, and carriers tunnel into the second floating gate 20 through the tunnel oxide film 18. If the edge 16a of the first floating gate 16 is pointed, the voltage necessary for the tunneling operation can be reduced. If an HTO film is formed on the first floating gate 16 and an oxygen annealing process with a high oxidation capability is carried out to reform the HTO film and create the tunnel oxide film 18, however, the polysilicon film constituting the first floating gate 16 will also be oxidized, giving the edge 16a a rounded shape and preventing the voltage necessary for the tunneling operation from being reduced.

In this embodiment, accordingly, the HTO film is formed on a nitride film 26 or an oxynitride film 28 that covers the first floating gate 16. Then when the oxygen annealing process is carried out on the HTO film, the edge 16a of the first floating gate 16 is not rounded, even if an annealing process with a high oxidation capability is used to reduce the electrical leakiness of the tunnel oxide film 18.

As described above, according to one aspect of the present invention, an HTO film is formed on a nitride film overlying a polysilicon film, and an oxygen annealing process is carried out on the HTO film to create a tunnel oxide film. This process can produce a less electrically leaky tunnel oxide film without oxidizing the underlying polysilicon film.

According to another aspect of the present invention, an HTO film is formed on an oxynitride film overlying a polysilicon film, and an oxygen annealing process is carried out on the HTO film to create a tunnel oxide film. Regardless of whether the oxygen annealing process is a dry process or a wet process, the oxygen annealing process can adequately and effectively reform the HTO film without oxidizing the underlying polysilicon film, thereby creating a less electrically leaky tunnel oxide film.

The preceding embodiments have illustrated several variations of the invented fabrication method, but those skilled in the art will recognize that further variations are possible within the scope of the invention, which is defined in the appended claims.

What is claimed is:

1. A method of fabricating a semiconductor device including a tunnel oxide film formed on a polysilicon layer, comprising:

forming a first film of silicon nitride or silicon oxynitride on the polysilicon layer;

forming a second film of silicon oxide on the first film by chemical vapor deposition; and oxygen-annealing the second film to form the tunnel oxide film.

2. The method of claim 1, wherein the first film is a film of silicon nitride, and oxygen-annealing the second film comprises wet oxygen annealing for five to ten minutes.

3. The method of claim 1, wherein the first film is a film of silicon nitride, and oxygen-annealing the second film comprises wet oxygen annealing at 850° C. to 900° C.

4. The method of claim 1, wherein the first film is a film of silicon oxynitride.

5. The method of claim 4, wherein the first film and the second film are formed by a continuous process.

6. The method of claim 4, wherein oxygen-annealing the second film comprises dry oxygen annealing for 30 to 60 minutes.

7. The method of claim 4, wherein oxygen-annealing the second film comprises dry oxygen annealing at 850° C. to 900° C.

8. The method of claim 4, wherein oxygen-annealing the second film comprises wet oxygen annealing for 5 to 60 minutes.

9. The method of claim 4, wherein oxygen-annealing the second film comprises wet oxygen annealing at 850° C. to 900° C.

10. The method of claim 1, wherein:

the polysilicon layer is formed on a silicon substrate and constitutes a first floating gate;

the semiconductor device also includes a second floating gate formed on the silicon substrate, overlapping at least an edge of the first floating gate; and the first film, the second film, and the tunnel oxide film separate the first floating gate from the second floating gate.

11. The method of claim 10, wherein the first film is a film of silicon nitride, and oxygen-annealing the second film comprises wet oxygen annealing for five to ten minutes.

12. The method of claim 10, wherein the first film is a film of silicon nitride, and oxygen-annealing the second film comprises wet oxygen annealing at 850° C. to 900° C.

13. The method of claim 10, wherein the first film is a film of silicon oxynitride.

14. The method of claim 13, wherein the first film and the second film are formed by a continuous process.

15. The method of claim 13, wherein oxygen-annealing the second film comprises dry oxygen annealing for 30 to 60 minutes.

16. The method of claim 13, wherein oxygen-annealing the second film comprises dry oxygen annealing at 850° C. to 900° C.

17. The method of claim 13, wherein oxygen-annealing the second film comprises wet oxygen annealing for 5 to 60 minutes.

18. The method of claim 13, wherein oxygen-annealing the second film comprises wet oxygen annealing at 850° C. to 900° C.

* * * * *